United States Patent
Condorelli et al.

(10) Patent No.: US 12,132,815 B2
(45) Date of Patent: Oct. 29, 2024

(54) METHOD OF CALIBRATING A CLOCK SIGNAL, AND CORRESPONDING ELECTRONIC DEVICE AND SYSTEM

(71) Applicant: STMicroelectronics S.r.l., Agrate Brianza (IT)

(72) Inventors: Riccardo Condorelli, Tremestieri Etneo / Catania (IT); Antonino Mondello, Messina (IT); Michele Alessandro Carrano, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 70 days.

(21) Appl. No.: 18/174,183

(22) Filed: Feb. 24, 2023

(65) Prior Publication Data
US 2023/0291538 A1  Sep. 14, 2023

(30) Foreign Application Priority Data
Mar. 11, 2022 (IT) .......................... 102022000004736

(51) Int. Cl.
*H04L 7/033* (2006.01)
*H03K 5/26* (2006.01)

(52) U.S. Cl.
CPC .............. *H04L 7/033* (2013.01); *H03K 5/26* (2013.01)

(58) Field of Classification Search
CPC ........ H04L 7/033; H03K 5/26; G01R 23/005; G01R 35/005

USPC ........................................................ 375/355
See application file for complete search history.

(56) References Cited

U.S. PATENT DOCUMENTS

| | | | |
|---|---|---|---|
| 4,737,971 A | 4/1988 | Lanzafame et al. | |
| 11,108,382 B1* | 8/2021 | Wong | G06F 1/08 |
| 2013/0083611 A1* | 4/2013 | Ware | G06F 3/0625 |
| | | | 365/191 |
| 2014/0021997 A1 | 1/2014 | Liu et al. | |

FOREIGN PATENT DOCUMENTS

EP          2667511 A2    11/2013

* cited by examiner

*Primary Examiner* — Fitwi Y Hailegiorgis
(74) *Attorney, Agent, or Firm* — Slater Matsil, LLP

(57) ABSTRACT

A method includes providing a reference clock signal having a reference period, providing a sampling clock signal having a sampling clock period shorter than the reference period of the reference clock signal, measuring the first subperiod as a first ratio of the first subperiod to the period of the sampling clock signal, measuring the second subperiod as a second ratio of the second subperiod to the period of the sampling clock signal, detecting a starting edge of a clock signal having a clock period greater than the reference period, producing a reconstructed reference signal based on the first ratio, the second ratio, and the detected starting edge, comparing the clock period of the clock signal with a period of the reconstructed reference signal to obtain a differential signal indicating a difference therebetween, and providing the differential signal to user circuitry for calibrating the clock signal.

20 Claims, 3 Drawing Sheets

METHOD OF CALIBRATING A CLOCK SIGNAL, AND CORRESPONDING ELECTRONIC DEVICE AND SYSTEM

CROSS-REFERENCE TO RELATED APPLICATIONS

This application claims the benefit of Italian Patent Application No. 102022000004736, filed on Mar. 11, 2022, which application is hereby incorporated herein by reference.

TECHNICAL FIELD

The description relates to methods of calibrating clock signals, e.g., in a system on chip (SoC). One or more embodiments may be applied to integrated circuits (ICs) and/or electronic devices in various contexts, such as microcontrollers (MCUs) employed in Internet-of-Things (IoT) applications.

BACKGROUND

Microcontrollers and other ICs use a variety of clocking signals to synchronize their internal operations.

Depending on the application, these circuits may benefit from a procedure of calibrating clock signals to provide some specific functionalities that involve a high degree of signal precision and accuracy.

For instance, in an IoT context that involves a plurality of small-size and low-cost electronic devices, calibrating clock signals facilitates tracking of devices and security of communications therebetween.

Improved ways of calibrating clock signals are thus desirable.

SUMMARY

An object of one or more embodiments is to contribute in providing such improved solutions.

According to one or more embodiments, that object can be achieved via a method having the features set forth in the claims that follow.

One or more embodiments may relate to a corresponding device, such as an integrated circuit, for instance.

One or more embodiments may relate to a corresponding system on chip (SoC).

The claims are an integral part of the technical teaching provided herein with reference to the embodiments.

One or more embodiments relate to calibrating a clock signal by providing a high-speed clock, sampling a reference clock using the high-speed clock and aligning the reference clock to the clock signal to be calibrated.

In one or more embodiments, a synchronization error may be advantageously self-compensated.

One or more embodiments can be interfaced with various types of buses, standard or customized.

In one or more embodiments, clock calibration can be performed periodically or be triggered by specific events (such as detection of a hacking attempt, for instance).

One or more embodiments may facilitate reducing costs and complexity, for instance by saving silicon area and power consumption.

BRIEF DESCRIPTION OF THE DRAWINGS

One or more embodiments will now be described, by way of non-limiting example only, with reference to the annexed Figures, wherein.

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The drawings are in simplified form and are not to precise scale.

Throughout the figures annexed herein, like parts or elements are indicated with like references/numerals unless the context indicates otherwise, and for brevity a corresponding description will not be repeated for each and every figure.

The references used herein are provided merely for convenience and hence do not define the extent of protection or the scope of the embodiments.

For the sake of simplicity, in the following detailed description a same reference symbol may be used to designate both a node/line in a circuit and a signal which may occur at that node or line.

Figure 1:
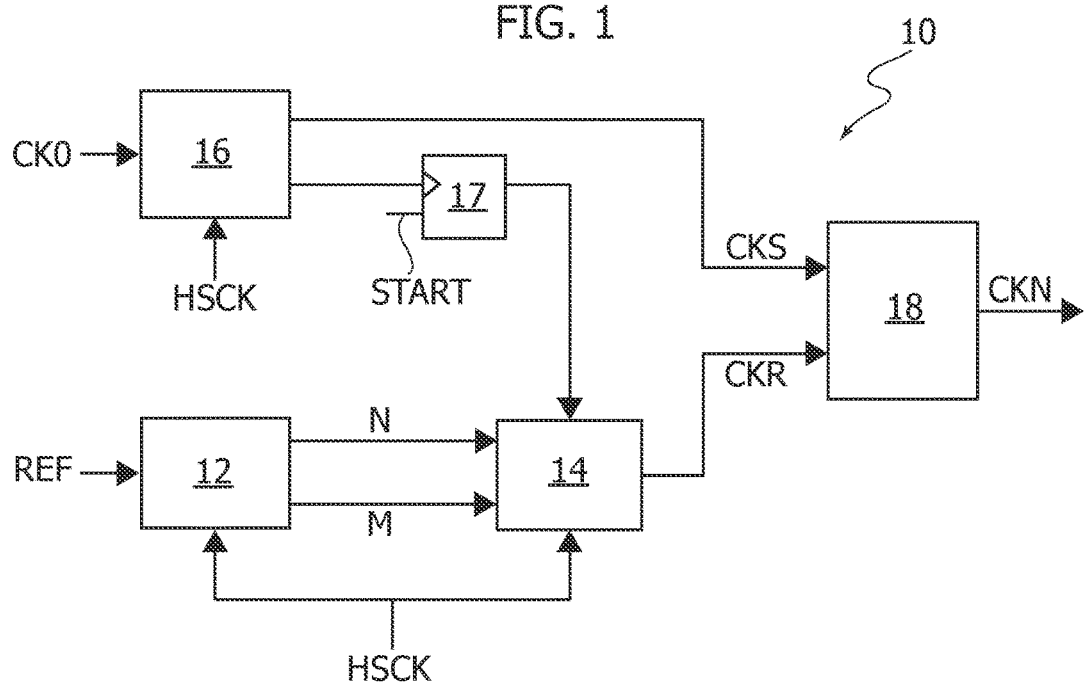
FIG. 1 is a diagram exemplary of a clock calibrating circuit as per the present disclosure.

As exemplified in FIG. 1, a clock calibrating circuit 10 comprises:

a clock input node CK0 configured to provide a clock signal to be calibrated, a reference clock signal REF, e.g., provided in a manner per se known by an integrated time base oscillator circuit;

a sampling circuit block 12 coupled to the reference input node REF to receive the reference clock signal REF therefrom, the sampling circuit block 12 configured to receive a sampling signal HSCK and to sample the reference clock signal REF therewith, obtaining as a result at least one clock parameter M, N of the reference clock signal REF, such as a length N of the high phase and a length M of the low phase of the reference clock REF or a sum thereof (e.g., N+M) measured in units of periods of the sampling signal HCSK, for instance;

a reconstructing circuit block 14 coupled to the sampling circuit block 12 to receive the clock parameters M, N therefrom and coupled to the synchronization circuit 16 via a data storing circuit block 17 to receive a start signal START therefrom, the reconstructing circuit block 14 configured to use the at least one clock parameter N, M to reconstruct a clock signal CKR that has the same period of the reference clock REF with the clock edges aligned to the clock edges of a sampled clock signal CKS, as discussed in the following, a synchronization circuit block 16 coupled to the clock input node CK0 and configured to receive a sampling signal HSCK, the synchronization circuit block 16 configured to sample the input clock signal CK0 therewith, obtaining as a result a sampled clock signal CKS to provide to the reconstructing circuit block 14;

a data storing circuit block 17 (e.g., a flip-flop) coupled to synchronization circuit block 16 to receive the sampled clock signal CKS as clock to temporize the data storing circuit block 17 to release the start signal START, and a comparator circuit block 18 (e.g., a frequency counter, per se known) configured to receive the reconstructed clock signal CKR and the sampled clock signal CKS (which are in phase therebetween), the comparator circuit block 18 configured to perform a comparison of the clock period of the clock signal and of the reconstructed reference signal, obtaining as a result of the comparison a differential (e.g., error) signal CKN indicative of a difference therebetween.

For instance, the error signal CKN is provided to user circuitry U (e.g., a set of various peripherals) configured to calibrate the clock signal based on the differential signal CKN using compensation techniques (such as direct or indirect frequency compensation, for instance) in a manner per se known, so that a corresponding description will not be repeated for the sake of brevity.

For the sake of simplicity, one or more embodiments are discussed in the following mainly with respect to a reference clock signal having a reference period $T_{REF}$ (that is the inverse of the frequency) shorter than the half-period $T_0/2$ of the clock signal to be calibrated CK0, facilitating a quicker calibrating procedure. Such an example of reference period is purely exemplary and in no way limiting as in one or more embodiments the reference period may also be equal or longer than the half-period $T_0/2$ of the clock signal to be calibrated CK0.

Figure 2:
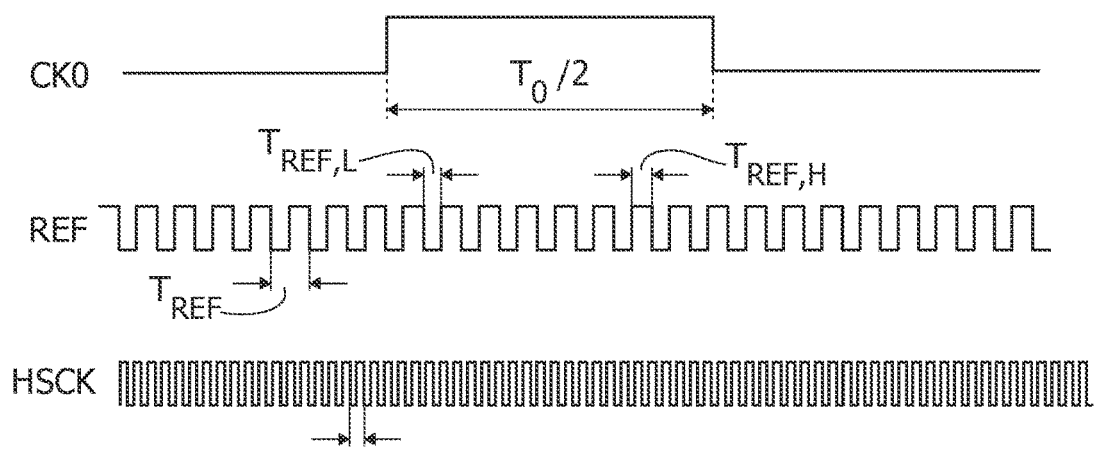
FIG. 2 is a time diagram of signals that may be employed in one or more embodiments.

As exemplified in FIG. 2, the sampling signal HSCK has a sampling period $T_{HSCK}$ much shorter (corresponding to a higher frequency) than the period $T_{REF}$ of the reference signal REF. For instance, the frequency of the sampling signal HSCK is a multiple (e.g., at least twice, preferably at least ten-fold so as to reduce errors) of the frequency of the reference signal REF.

As exemplified in FIG. 2, the sampling signal HSCK provided has a reduced quality (e.g., accuracy) with respect to the reference signal REF, e.g., sampling signal HSCK may have a duty cycle slightly different than 50%.

As exemplified in FIG. 1, the sampling circuit block 12 measures the high and the low phase for any cycle of the reference clock CK, obtaining the numbers N, M of clock periods $T_{HSCK}$ of the sampling signal HSCK that are in a period $T_{REF}$ of the reference CK.

For instance, these clock parameters N, M may be expressed as:

$$N = T_{REF,H}/T_{HSCK}$$

$$M = T_{REF,L}/T_{HSCK}$$

where $T_{REF,H}$ is the duration of the time interval in which the reference clock signal has a first, e.g., high, logic value, and $T_{REF,L}$ is the duration of the time interval in which the reference clock signal has a second, e.g., low, logic value.

For instance, in an exemplary scenario in which the signals have an evolution over time as exemplified in FIG. 2, the sampling circuit block 12 measures how many times the period $T_{HCSK}$ of the sampling signal HCSK is contained in the reference period $T_{REF}$ of the reference signal REF, e.g., N=2, M=2.

Figure 3:
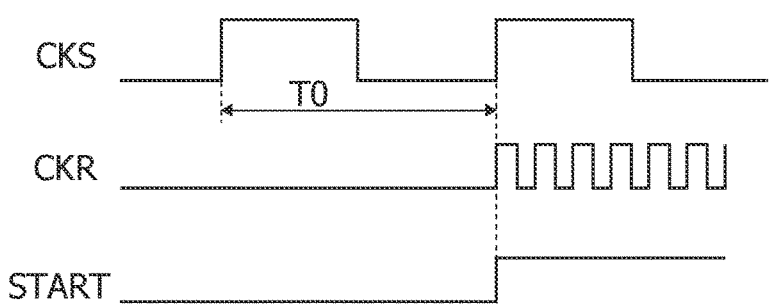
FIG. 3 is a further time diagram of signals that may be employed in one or more embodiments.

As exemplified in FIGS. 1 and 3:

the synchronization circuit block 16 produces a synchronized clock signal CKS that is synchronized with the sampling signal HSCK, and based on the clock parameters N, M and triggered by the start signal START provided via the flip-flop 17, the reconstructing circuit block 14 generates (e.g., via a programmable oscillator circuit, in a manner per se known) a reconstructed clock signal CKR that is synchronous with the sampling signal HSCK.

As exemplified in FIG. 3, thanks to these two signals CKS and CKR being synchronous on the HSCK clock, the synchronization error is auto compensated.

As used herein, "synchronous clock signals" refers to clock signals having rising (or falling) edges start at time instants, as determined starting from a start signal START, as exemplified in FIG. 3.

As exemplified in FIG. 1, the signals CKS, CKR are provided to a comparator circuit block 18 (known per se) configured to produce the error signal CKN, e.g., subsequently provided to user circuitry U to calibrate the clock signal CK0 therewith (in a manner per se known).

As exemplified in FIGS. 1 to 3, a method comprises:

providing a reference clock signal REF having a reference period $T_{REF}$, the reference clock signal having a first logic value during a first subperiod $T_{REF,H}$ of the reference period and a second logic value during a second subperiod $T_{REF,L}$ of the reference period;

providing a sampling clock signal HSCK having a sampling clock period $T_{HSCK}$, wherein the sampling clock period ($T_{HSCK}$) is shorter than the reference period of the reference clock signal;

measuring 12 the first subperiod as a first ratio N of the first subperiod $T_{REF,H}$ to the period of the sampling clock signal HSCK;

measuring the second subperiod as a second ratio M of the second subperiod $T_{REF,L}$ to the period of the sampling clock signal;

detecting 16 a starting edge START of a clock signal CK0 having a clock period T0 greater than the reference period, producing 14 a reconstructed reference signal CKR based on the first ratio, the second ratio and the detected starting edge;

performing a comparison 18 of the clock period T0 of the clock signal with a period of the reconstructed reference signal, obtaining as a result of the comparison, a differential signal CKN indicative of a difference therebetween, and providing the differential signal to user circuitry U configured to calibrate the clock signal based on the differential signal.

For instance, the reconstructed reference signal CKR has a reconstructed period equal to the reference period and is synchronized to the detected starting edge.

As exemplified in FIGS. 1 to 3, the method comprises:

sampling 16 the clock signal via the sampling clock signal, obtaining as a result a sampled clock signal CKS, wherein the sampled clock signal and the reconstructed reference signal have respective clock edges synchronized at a same time instant;

performing a comparison 18 of the clock period of the clock signal with a period of the reconstructed reference signal, obtaining as a result of the comparison, a differential signal CKN indicative of a difference therebetween, and providing the differential signal to user circuitry configured to calibrate the clock signal based on the differential signal.

As exemplified in FIGS. 1 to 3, the method comprises setting a time length START_CAL_INT of a time interval and repeating 45 the comparison 18 after lapse of the set time length.

For instance, the clock period of the clock signal is affected by at least one physical quantity.

As exemplified in FIGS. 1 to 3, the method comprises:

receiving a set of sensing signals TS, VS, TTS indicative of the at least one physical quantity affecting the clock signal, and triggering 42, START_CAL_sel performing the comparison in response to the sensing signal being indicative of the physical quantity affecting the clock period.

For instance, the method comprises enabling 48 performing the comparison in response to receiving at least one enable calibration signal START_CAL_int, START_CAL_sel, START_CAL.

Figure 4:
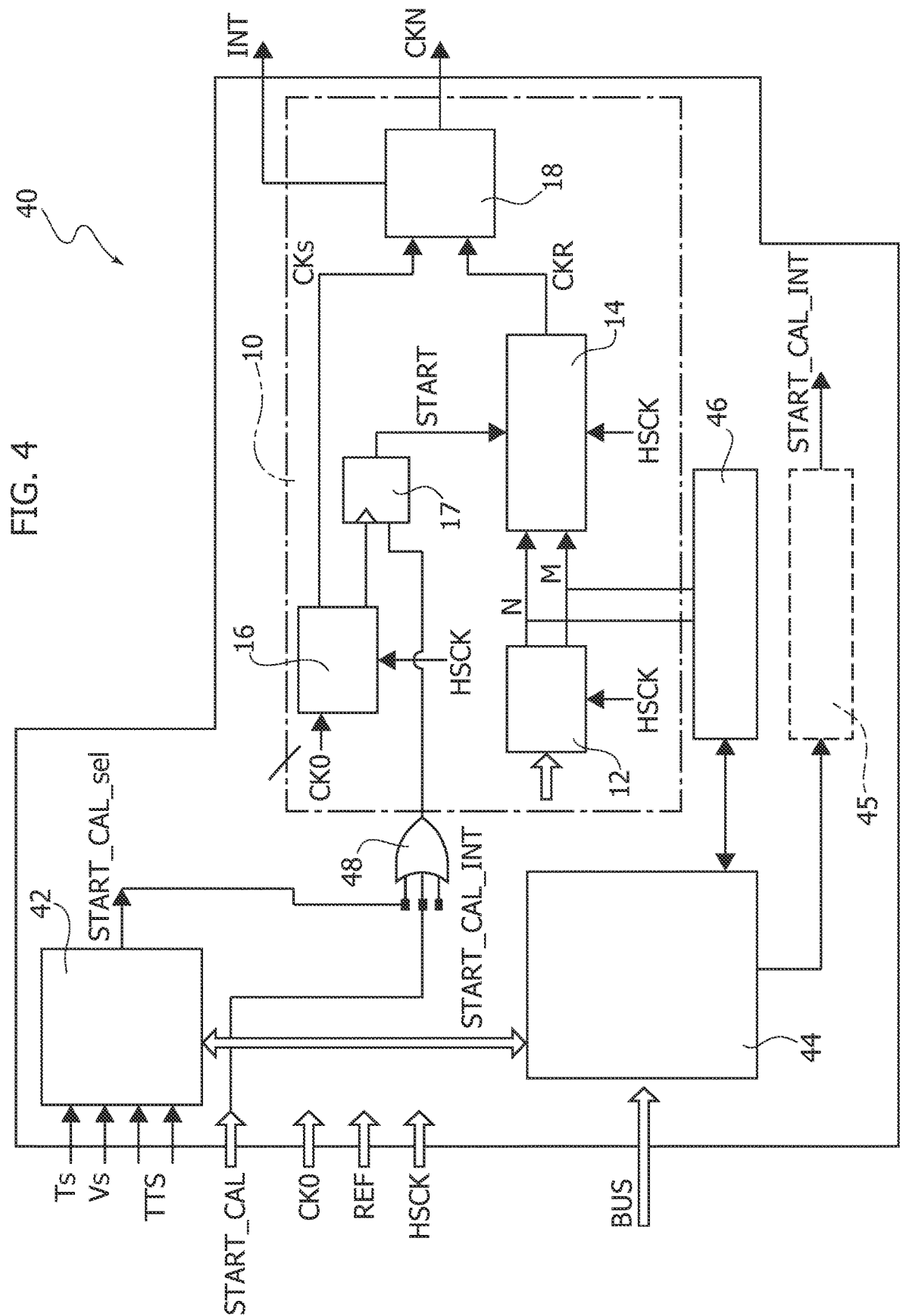
FIG. 4 is a diagram exemplary of a device as per the present disclosure.

As exemplified in FIG. 4, the circuit 10 may be embedded in an electronic device 40, such as a clock reconstructing peripheral device.

As exemplified in FIG. 4, the circuit 10 can be interfaced to any standard or custom bus architecture (such as AHB, APB, OBI, per se known).

As exemplified in FIG. 4, the circuit 10 may be triggered to calibrate the clock signal CK0 either periodically or in response to some important events that may be detected via trigger signals TS, VS, TTS. For instance, the trigger signals may be indicative of battery level, temperature variation, reset of the device, hacking attempt detection, and may be provided by dedicated sensors (e.g., voltage detector VS, temperature sensor TS, tampering sensor TI'S) in a manner per se known.

As exemplified in FIG. 4, the device 40 comprises:

a start input node START_CAL configured to receive a start signal to force start of the calibration procedure of circuit 10, a bus node BUS configured to be coupled to any standard or custom bus architecture to provide thereto the calibrated clock signal CKN, a calibration trigger circuit block 42 configured to be coupled to a set of sensors TS, VS, TI'S to receive therefrom sensing signals VS, TS, TI'S indicative of a malfunctioning or anomalous condition, the calibration trigger circuit block 42 producing a calibration trigger signal START_CAL_sel based on the sensing signals received VS, TS, TI'S, a bus interface 44 coupled to the bus node BUS to pass data thereto/therefrom, such as a standard interface known per se (e.g., AHB, APB, OBI, AXI, and so on), optionally, a timer 45 that may be set to periodically produce a trigger signal START_CAL_INT to ignite the circuit 10, a logic OR port coupled to the start node START, to the calibration trigger circuit block 42 and, optionally, to the timer 45 to receive therefrom respective trigger signals START_CAL, START_CAL_sel, START_CAL_INT, the logic OR coupled to the circuit 10 to provide thereto an OR'd trigger signal configured to initialize the clock calibration procedure in the circuit 10, optionally, a status register 46 where to store configuration data for the circuit 10, as discussed in the following.

It is noted that, while represented as components outside of the circuit 10, the timer 45 and the status register 46 may be integrated already in the circuit 10 in one or more embodiments.

As exemplified in FIGS. 1 to 4, an electronic device 40 comprises:

a reference clock node REF configured to provide a reference clock signal REF having a reference period $T_{REF}$, the reference clock signal having a first logic value during a first subperiod $T_{REF,H}$ of the reference period $T_{REF}$ and having a second logic value during a second subperiod $T_{REF,L}$ of the reference period;

a sampling clock node HSCK configured to receive a sampling clock signal HSCK having a sampling clock period $T_{HSCK}$, wherein the sampling clock period $T_{HSCK}$ is shorter than the reference period of the reference clock signal;

a measuring circuit block 12 configured to:

measure the first subperiod as a first ratio N of the first subperiod $T_{REF,H}$ to the period of the sampling clock signal;

measure the second subperiod as a second ratio M of the second subperiod $T_{REF,L}$ to the period of the sampling clock signal, a detecting circuit block 16 configured to detect a starting edge START of a clock signal CK0 having a clock period T0 greater than the reference period, a reconstructing circuit block 14 configured to produce a reconstructed reference signal CKR based on the measured first and second number of periods of the sampling clock and on the detected starting edge, and a comparator circuit block 18 configured to perform a comparison of the clock period of the clock signal with a period of the reconstructed reference signal, obtaining as a result of the comparison, a differential signal CKN indicative of a difference therebetween, the comparator circuit block configured to provide the differential signal to user circuitry U to calibrate the clock signal based on the differential signal.

For instance, the reconstructing circuit block is configured to produce the reconstructed reference signal having a reconstructed period equal to the reference period and beginning at a time instant equal to the detected starting edge.

As exemplified in FIGS. 1 to 4, the detecting circuit block is configured to sample the clock signal via the sampling clock signal, obtaining as a result a sampled clock signal CKS, wherein the sampled clock signal and the reconstructed reference signal have respective clock edges that start at a same time instant START and wherein the comparator circuit block is configured to perform a comparison of the clock period of the clock signal with a period of the reconstructed reference signal, obtaining as a result of the comparison, a differential signal CKN indicative of a difference therebetween.

For instance, the comparator circuit block is configured to provide the differential signal to user circuitry to calibrate the clock signal based on the differential signal.

As exemplified in FIG. 4, the electronic device comprises a register circuit block 46 configured to store a time length START_CAL_INT of a time interval and a timer circuit block 45 configured to trigger the comparator circuit to repeat the comparison after lapse of the set time length.

For instance, the clock period of the clock signal is affected by at least one physical quantity.

As exemplified in FIG. 4, the electronic device comprises event selection circuitry 42 configured to receive a set of sensing signals TS, VS, TI'S indicative of the at least one physical quantity affecting the clock signal and configured to trigger 42, START_CAL_sel the comparator circuit block to repeat the comparison in response to the sensing signal being indicative of the physical quantity affecting the clock period.

As exemplified in FIG. 4, the electronic device comprises logic circuitry 48 configured to enable the comparator circuit block to perform the comparison in response to receiving at least one enable calibration signal START_CAL_int, START_CAL_sel, START_CAL.

As exemplified in FIG. 4, the BUS interface 44 may be used by a user to (re-)write in the internal registers 46 of the device 40 the way in which the circuit 10 operates, e.g., by determining whether to use the internal or external timer.

For instance, in case the internal timer source 45 is selected, the calibration can be scheduled by that timer using standard BUS cycle, in a manner per se known.

For instance, in case of external trigger source 42, the configuration data provided by the user via the bus interface 44 may select which one or kind of event that triggers the calibration among the signals in the set of sensing signals VS, TS, TI'S.

As exemplified in FIG. 4, the circuit 10 may be adapted so as to provide an interrupt signal INT together with the error signal CKN.

For instance, this interrupt generation INT may be useful to alert the system that a calibration procedure was completed and that a frequency error value is available. Such value can be used, for instance, by the central processing unit (CPU) to (re-)trim internal clock sources.

Figure 5:
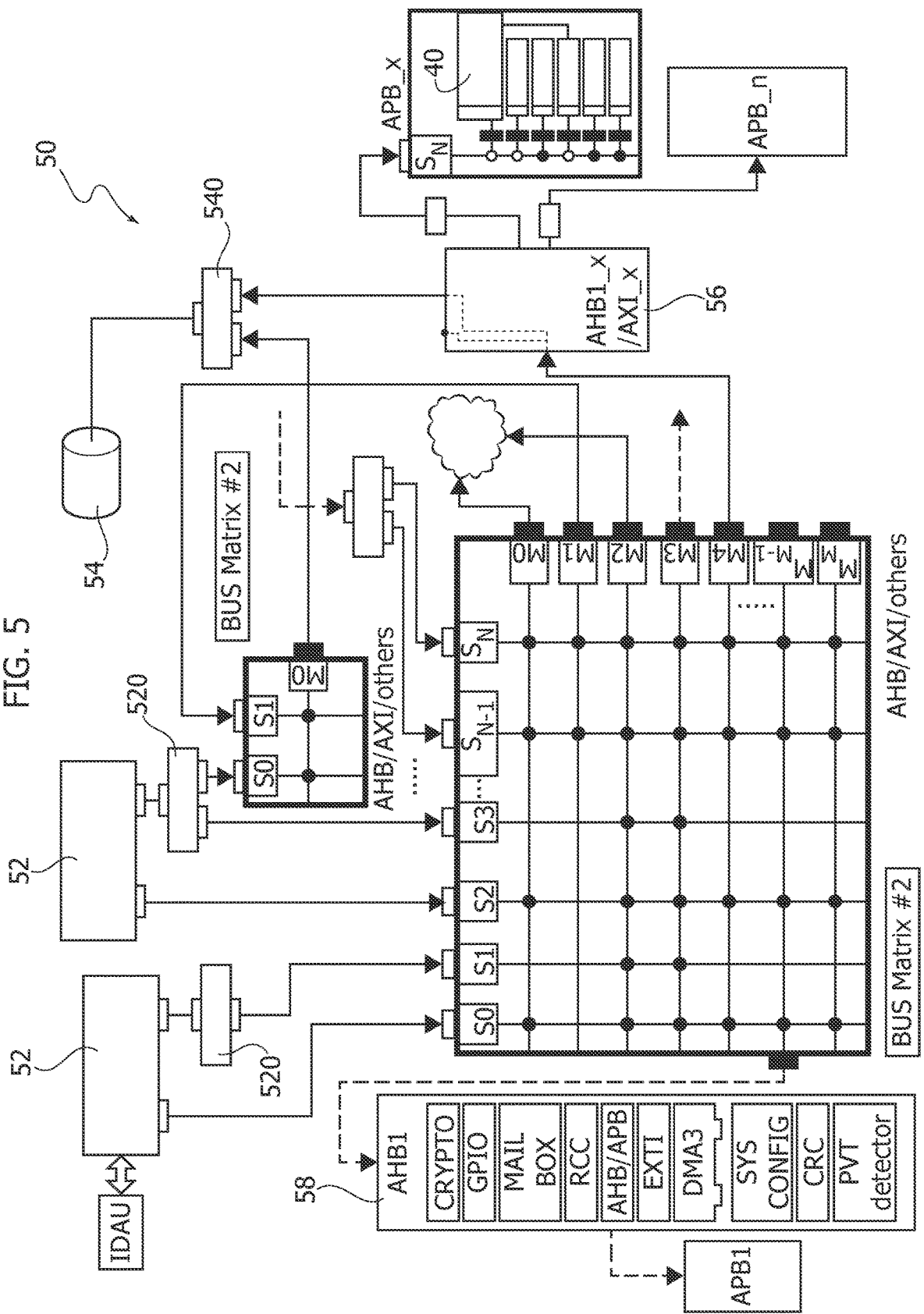
FIG. 5 is a diagram exemplary of a system on chip as per the present disclosure.

As exemplified in FIG. 5, the clock reconstructing circuit 10 and/or device 40 may be integrated in a system-on-chip (SOC) architecture as a generic peripheral interfaced via a standard bus, providing an increased flexibility.

As exemplified in FIGS. 1 to 5, a system-on-chip (SoC) 50 comprises:
 a set of processing cores 52 configured to operate based on at least one clock signal CK0,
 a device 40 as exemplified in FIGS. 1 to 4 coupled to the set of processing cores, the device configured to receive the at least one clock signal CK0 and to provide to user circuitry U a differential signal CKN indicative of a difference between the clock period T0 of the clock signal and a period of the reconstructed reference signal CKR.

As exemplified in FIG. 5, the SoC 50 comprises:
 a set of processing circuit blocks (or processing core) 52 coupled to respective cache memory blocks 520 and to one or more flash memories 54 (and respective flash memory interface 540) via one or more BUS matrices, e.g., an AHB1 bus matrix 58, known per se.

As exemplified in FIG. 5, the cache 520 may be coupled to the respective processing core 52 via a (e.g., 128 bit) C-bus, in a manner known per se, while an S-bus may be employed to couple the processing core 52 to the BUS matrix 58.

As exemplified in FIG. 5, the flash memory 54 may be coupled to the interface 540 via a respective BUS configured to transfer blocks of 128 bits plus an ECC signal.

For instance, the device 40 may communicate with the processing circuit cores via a peripheral interface 56, in a manner known per se so that a corresponding description is omitted for the sake of brevity.

One or more embodiments may be adapted for use together with a SoC architecture, for instance as that of a microcontroller (e.g., memory and peripherals) provided by STMicroelectronics under the commercial name of 32U575/585.

As exemplified in FIG. 4, the electronic device 40 may be integrated in the SoC 50 as a peripheral interfaced 56 via a standard bus architecture, with an increased versatility. For instance, the peripheral 40 may exploited to provide error signals for calibrating clock signals in the SoC, where clock calibration based on the error signal CKN may be performed in a way per se known based on the kind of oscillator giving rise to the clock signal to calibrate.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection. The extent of protection is defined by the annexed claims.

What is claimed is:

1. A method, comprising:
 providing a reference clock signal having a reference period, the reference clock signal having a first logic value during a first subperiod of the reference period and a second logic value during a second subperiod of the reference period;
 providing a sampling clock signal having a sampling clock period, the sampling clock period being shorter than the reference period of the reference clock signal;
 measuring the first subperiod as a first ratio of the first subperiod to the sampling clock period;
 measuring the second subperiod as a second ratio of the second subperiod to the sampling clock period;
 detecting a starting edge of a first clock signal having a first clock period greater than the reference period;
 producing a reconstructed reference signal based on the first ratio, the second ratio and the detected starting edge;
 performing a comparison of the first clock period of the first clock signal with a period of the reconstructed reference signal, obtaining, as a result of the comparison, a differential signal indicative of a difference therebetween; and providing the differential signal to user circuitry configured to calibrate the first clock signal based on the differential signal.

2. The method of claim 1, wherein the reconstructed reference signal has a reconstructed period equal to the reference period, and is synchronized to the detected starting edge.

3. The method of claim 1, further comprising:
sampling the first clock signal via the sampling clock signal, obtaining as a result a sampled clock signal, the sampled clock signal and the reconstructed reference signal having respective clock edges synchronized at a same time instant.

4. The method of claim 1, further comprising:
setting a time length of a time interval; and
repeating the comparison after lapse of the set time length.

5. The method of claim 1, wherein the first clock period of the first clock signal is affected by at least one physical quantity, and wherein the method comprises:
receiving a set of sensing signals indicative of the at least one physical quantity affecting the first clock signal; and
triggering performing the comparison in response to the sensing signals being indicative of the at least one physical quantity affecting the first clock period.

6. The method of claim 1, further comprising:
enabling performing the comparison in response to receiving at least one enable calibration signal.

7. An electronic device, comprising:
a reference clock node configured to provide a reference clock signal having a reference period, the reference clock signal having a first logic value during a first subperiod of the reference period and having a second logic value during a second subperiod of the reference period;
a sampling clock node configured to receive a sampling clock signal having a sampling clock period, wherein the sampling clock period is shorter than the reference period of the reference clock signal;
a measuring circuit block configured to:
measure the first subperiod as a first ratio of the first subperiod to the period of the sampling clock signal; and
measure the second subperiod as a second ratio of the second subperiod to the period of the sampling clock signal;
a detecting circuit block configured to detect a starting edge of a first clock signal having a first clock period greater than the reference period;
a reconstructing circuit block configured to produce a reconstructed reference signal based on the measured first and second number of periods of the sampling clock signal and on the detected starting edge; and
a comparator circuit block configured to:
perform a comparison of the first clock period of the first clock signal with a period of the reconstructed reference signal, obtaining, as a result of the comparison, a differential signal indicative of a difference therebetween; and
provide the differential signal to user circuitry to calibrate the first clock signal based on the differential signal.

8. The electronic device of claim 7, wherein the reconstructing circuit block is configured to produce the reconstructed reference signal having a reconstructed period equal to the reference period, and beginning at a time instant equal to the detected starting edge.

9. The electronic device of claim 7, wherein the detecting circuit block is configured to sample the first clock signal via the sampling clock signal, obtaining as a result a sampled clock signal, wherein the sampled clock signal and the reconstructed reference signal have respective clock edges that start at a same time instant.

10. The electronic device of claim 7, further comprising:
a register circuit block configured to store a time length of a time interval; and
a timer circuit block configured to trigger the comparator circuit block to repeat the comparison after lapse of the stored time length.

11. The electronic device of claim 7, wherein the first clock period of the first clock signal is affected by at least one physical quantity, and wherein the electronic device comprises event selection circuitry configured to:
receive a set of sensing signals indicative of the at least one physical quantity affecting the first clock signal; and
trigger the comparator circuit block to repeat the comparison in response to the sensing signals being indicative of the at least one physical quantity affecting the first clock period.

12. The electronic device of claim 7, further comprising logic circuitry configured to enable the comparator circuit block to perform the comparison in response to receiving at least one enable calibration signal.

13. The electronic device of claim 7, wherein the comparator circuit block is further configured to provide an interrupt signal indicating that the differential signal is available to the user circuitry.

14. A system-on-chip, comprising:
a set of processing cores configured to operate based on at least one clock signal;
a device coupled to the set of processing cores and configured to receive the at least one clock signal, the device comprising:
a reference clock node configured to provide a reference clock signal having a reference period, the reference clock signal having a first logic value during a first subperiod of the reference period and having a second logic value during a second subperiod of the reference period;
a sampling clock node configured to receive a sampling clock signal having a sampling clock period, wherein the sampling clock period is shorter than the reference period of the reference clock signal;
a measuring circuit block configured to:
measure the first subperiod as a first ratio of the first subperiod to the period of the sampling clock signal; and
measure the second subperiod as a second ratio of the second subperiod to the period of the sampling clock signal;
a detecting circuit block configured to detect a starting edge of the at least one clock signal having at least one clock period greater than the reference period;
a reconstructing circuit block configured to produce a reconstructed reference signal based on the measured first and second number of periods of the sampling clock signal and on the detected starting edge; and
a comparator circuit block configured to:
perform a comparison of the at least one clock period of the at least one clock signal with a period of the reconstructed reference signal, obtaining, as a result of the comparison, a differential signal indicative of a difference therebetween; and provide the differential signal to user circuitry to calibrate the at least one clock signal based on the differential signal.

15. The system-on-chip of claim 14, wherein the reconstructing circuit block is configured to produce the reconstructed reference signal having a reconstructed period equal to the reference period, and beginning at a time instant equal to the detected starting edge.

16. The system-on-chip of claim 14, wherein the detecting circuit block is configured to sample the at least one clock signal via the sampling clock signal, obtaining as a result a sampled clock signal, wherein the sampled clock signal and the reconstructed reference signal have respective clock edges that start at a same time instant.

17. The system-on-chip of claim 14, wherein the device further comprises:
 a register circuit block configured to store a time length of a time interval; and
 a timer circuit block configured to trigger the comparator circuit block to repeat the comparison after lapse of the stored time length.

18. The system-on-chip of claim 14, wherein the at least one clock period of the at least one clock signal is affected by at least one physical quantity, and wherein the device comprises event selection circuitry configured to:
 receive a set of sensing signals indicative of the at least one physical quantity affecting the at least one clock signal; and
 trigger the comparator circuit block to repeat the comparison in response to the sensing signals being indicative of the at least one physical quantity affecting the at least one clock period.

19. The system-on-chip of claim 14, wherein the device further comprises logic circuitry configured to enable the comparator circuit block to perform the comparison in response to receiving at least one enable calibration signal.

20. The system-on-chip of claim 14, wherein the comparator circuit block is further configured to provide an interrupt signal indicating that the differential signal is available to the user circuitry.

* * * * *